(12) United States Patent  (10) Patent No.: US 9,129,924 B2
Li et al.  (45) Date of Patent: Sep. 8, 2015

(54) OLED DISPLAY WITH SPALLED SEMICONDUCTOR DRIVING CIRCUITRY AND OTHER INTEGRATED FUNCTIONS

(71) Applicant: International Business Machines Corporation, Armonk, NY (US)

(72) Inventors: Ning Li, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/041,853

(22) Filed: Sep. 30, 2013

(65) Prior Publication Data

US 2014/0087504 A1    Mar. 27, 2014

Related U.S. Application Data

(63) Continuation of application No. 13/625,301, filed on Sep. 24, 2012, now abandoned.

(51) Int. Cl.
*H01L 27/00* (2006.01)
*H01L 27/32* (2006.01)
*H01L 33/00* (2010.01)

(52) U.S. Cl.
CPC ............ *H01L 27/3251* (2013.01); *H01L 27/32* (2013.01); *H01L 27/3209* (2013.01); *H01L 27/3225* (2013.01); *H01L 33/0079* (2013.01)

(58) Field of Classification Search
CPC . H01L 27/32; H01L 27/3225; H01L 27/3251; H01L 33/0079; H01I 27/3209
See application file for complete search history.

(56) References Cited

U.S. PATENT DOCUMENTS

| | | | |
|---|---|---|---|
| 7,416,924 B2 | 8/2008 | Noguchi et al. | |
| 2004/0259326 A1* | 12/2004 | Hideo | 438/458 |
| 2008/0308792 A1 | 12/2008 | Takahashi et al. | |
| 2009/0114926 A1 | 5/2009 | Yamazaki | |
| 2010/0178738 A1 | 7/2010 | Noguchi et al. | |

OTHER PUBLICATIONS

Yang, C.-J., et al., "Organic light-emitting devices integrated with solar cells: High contrast and energy recycling", Applied Physics Letters 90, 173507, Apr. 25, 2007.
"OLED: An emerging display technology", White Paper, published in and based on information as of Jan. 2007.
(Continued)

*Primary Examiner* — Su C Kim
(74) *Attorney, Agent, or Firm* — Scully, Scott, Murphy & Presser, P.C.; Louis J. Percello, Esq.

(57) ABSTRACT

Spalling is employed to generate a single crystalline semiconductor layer. Complementary metal oxide semiconductor (CMOS) logic and memory devices are formed on a single crystalline semiconductor substrate prior to spalling. Organic light emitting diode (OLED) driving circuitry, solar cells, sensors, batteries and the like can be formed prior to, or after, spalling. The spalled single crystalline semiconductor layer can be transferred to a substrate. OLED displays can be formed into the spalled single crystalline semiconductor layer to achieve a structure including an OLED display with semiconductor driving circuitry and other functions integrated on the single crystalline semiconductor layer.

18 Claims, 6 Drawing Sheets

(56) References Cited

OTHER PUBLICATIONS

Lin, C.-L., et al., "LTPS-TFT Pixel Circuit to Compensate for OLED Luminance Degradation in Three-Dimensional AMOLED Display", IEEE Electron Device Letters, May 2012, vol. 33, No. 5.

Chen, P.-C., et al., "High-Performance Single-Crystalline Arsenic-Doped Indium Oxide Nanowires for Transparent Thin-Film Transistors and ActiveMatrix Organic Light-Emitting Diode Displays", www.acsnano.org, Oct. 20, 2009, vol. 3, No. 11, pp. 3383-3390.

Ahn, J.-H., et al., "High-Speed Mechanically Flexible Single-Crystal Silicon Thin-Film Transistors on Plastic Substrates", IEEE Electron Device Letters, Jun. 2006, vol. 27, No. 6.

Yuan, H.-C., et al., "High-speed strained-single-crystal-silicon thin-film transistors on flexible polymers", Journal of Applied Physics, Jul. 14, 2006, 100, 013708.

Office Action dated Mar. 27, 2014 received in a related U.S. Appl. No. 13/658,473.

\* cited by examiner

OLED DISPLAY WITH SPALLED SEMICONDUCTOR DRIVING CIRCUITRY AND OTHER INTEGRATED FUNCTIONS

CROSS REFERENCE TO RELATED APPLICATION

This application is a continuation of U.S. patent application Ser. No. 13/625,301, filed Sep. 24, 2012 the entire content and disclosure of which is incorporated herein by reference.

BACKGROUND

The present disclosure relates to a method of forming a semiconductor structure, and more particularly to a method of forming a semiconductor structure which includes an organic light emitting diode (OLED) display with OLED driving circuitry, logic and memory devices, as well as other functions integrated on a same single crystalline semiconductor substrate. The present disclosure also relates to the semiconductor structure that is formed utilizing the method of the present disclosure.

In recent years, mobile information and telecommunication devices such as computing Notebooks and personal digital assistants (PDAs) have experienced rapid development. Such devices are becoming lighter and more efficient. Recently, flat panel displays are becoming more and more popular for such devices. Currently, liquid crystal displays (LCDs) are used as flat panel displays, although LCDs have some disadvantages, e.g., the need for background lighting and a limited viewing angle.

Besides liquid crystals, organic light emitting diodes, so-called "organic LEDs", or "OLEDs", can be used in flat panel displays. Such OLEDs have a higher luminous efficiency and an increased viewing angle as compared to LCD's. The basic feature of the OLED is the electroluminescence of specific organic materials. The specific organic material determines in a first approximation the color, i.e., the wavelengths, of the light emitted by the corresponding OLED.

A typical OLED comprises a substrate which is usually made of glass or a similar transparent material. An anode layer is positioned on the substrate. The anode layer can be made of a material having a relatively high work function and is substantially transparent for visible light. A typical material for the anode layer is indium tin oxide (ITO). A layer of electroluminescent material is positioned on the anode layer, serving as the emitting layer of the organic OLED. Common materials for forming the emitting layer are polymers such as, for example, poly(p-phenylenvinylene) (PPV) and molecules like tris(8-oxychinolinato)aluminum (Alq3). In the case of molecules, the emitting layer typically comprises several layers of the molecules. A cathode layer of material having a lower work function like aluminum (Al), calcium (Ca) or magnesium (Mg) is positioned on the emitting layer. During operation of the OLED, the cathode layer and the anode layer are connected to a power supply.

The basic principles of electroluminescence and, thus, of the OLED are the following: The anode layer and the cathode layer inject charge carriers, i.e., electrons and holes, into the emitting layer. In the emitting layer, the charge carriers are transported and the charge carriers of opposite charge form so called excitons, i.e., excited states. The excitons decay radiatively into the ground state by generating light. The generated light is then emitted by the OLED through the anode layer which is made of transparent material like ITO. The color of the generated light depends on the material used for the organic layer.

Furthermore, a so-called multilayer OLED is known. The multilayer OLED comprises a plurality of cathode layers and/or a plurality of organic layers and/or a plurality of anode layers. By using a plurality of organic layers, the efficiency of the OLED can be increased compared to the organic LED comprising a single organic layer. The boundary surface between two organic layers of the plurality of organic layers can act as a barrier which reduces the current flow through the diode for at least one charge carrier type (electrons or holes). Therefore, the at least one charge carrier type accumulates at the boundary surface and thus the recombination probability of the electrons and the holes is increased leading to a higher efficiency of the OLED.

SUMMARY

A cost-effective process is provided for improving the performance of OLED driving circuitry, while integrating various electronic functions such as, for example, logic, memory, solar cell, battery, and/or sensor, with an OLED display on a single piece of semiconductor material. In particular, the present disclosure utilizes spalling to generate a spalled semiconductor material containing driving circuitry for an OLED display, while at the same time integrating many functions including, for example, logic, memory, sensors, battery and/or solar cells. The driving circuitry of the OLED display is improved with higher drive current and longer lifetime. Monolithic integration of logic, memory and other devices is thus made possible by using the method of the present disclosure.

Specifically, spalling is employed to generate a single crystalline semiconductor layer. Complementary metal oxide semiconductor (CMOS) logic and memory devices are formed on a single crystalline semiconductor substrate prior to spalling. OLED driving circuitry, solar cells, sensors, batteries and the like can be formed prior to, or after, spalling. The spalled single crystalline semiconductor layer can be transferred to a substrate. OLED displays can be formed into the spalled single crystalline semiconductor layer to achieve a structure including an OLED display with semiconductor driving circuitry and other functions integrated on the single crystalline semiconductor layer.

In one aspect of the present disclosure a method of forming a structure including an OLED display with semiconductor driving circuitry and other functions is provided. The method of the present disclosure includes providing a single crystalline semiconductor substrate having at least logic and memory devices formed on an exposed surface of the single crystalline semiconductor substrate. A surface protection layer is then formed on the exposed surface of the single crystalline semiconductor substrate having the at least logic and memory devices formed thereon. A stressor layer is then formed above the surface protection layer and thereafter spalling is performed. Spalling provides a spalled single crystalline semiconductor layer having the at least logic and memory devices located on a surface thereof. A substrate is formed on a surface of the spalled single crystalline semiconductor layer opposite the surface having the at least logic and memory devices located thereon. Next, an organic light emitting diode (OLED) display is formed on the spalled single crystalline semiconductor layer and adjacent the at least logic and memory devices.

In other aspect of the present disclosure, a semiconductor structure is provided. The semiconductor structure includes a single crystalline semiconductor layer having an OLED display with underlying OLED driving circuitry located on one portion of the single crystalline semiconductor layer and CMOS logic and memory devices located on another portion of the single crystalline semiconductor layer.

DETAILED DESCRIPTION OF THE DRAWINGS

DETAILED DESCRIPTION

Figure 1:
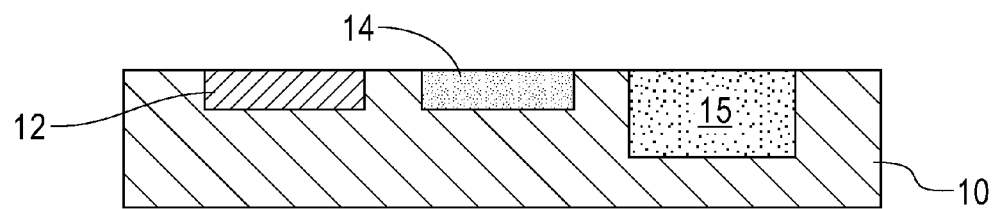
FIG. 1 is a pictorial representation (through a cross sectional view) illustrating a single crystalline semiconductor substrate which includes at least OLED driving circuitry and logic and memory devices fabricated thereon in accordance with a first process embodiment of the present disclosure.

The present disclosure, which provides a method for forming a semiconductor structure in which an OLED display with OLED driving circuitry, CMOS logic and memory devices, as well as other functions are integrated on a same single crystalline semiconductor substrate, will now be described in greater detail by referring to the following discussion and drawings that accompany the present application. It is noted that the drawings of the present application are provided for illustrative purposes and, as such, they are not drawn to scale. In the drawings and the description that follows, like materials are referred to by like reference numerals. For purposes of the description hereinafter, the terms "upper", "lower", "right", "left", "vertical", "horizontal", "top", "bottom", and derivatives thereof shall relate to the components, layers and/or materials as oriented in the drawing figures which accompany the present application.

In the following description, numerous specific details are set forth, such as particular structures, components, materials, dimensions, processing steps and techniques, in order to provide a thorough understanding of the present invention. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

Electronic modules such as display, logic, memory, battery, sensor etc. are usually fabricated separately and connected together to achieve an electronic system. Such a configuration has shortcomings. For example, an OLED display is driven by thin film transistors (TFTs) which are based on amorphous silicon or polysilicon. However, these technologies have disadvantages (amorphous silicon has low drive current and short lifetime; polysilicon requires precise process control and relative high processing temperatures) and can be improved with single crystalline silicon driving circuitry, which increases costs. Also, logic and memories are formed on single crystalline silicon chips and can not be monolithically integrated with display and other functions. This hybrid approach makes the system less efficient and increases the packaging cost. Also, as touch-screen displays are becoming more and more important in electronic devices as a human-machine interface, a cost-effective way is needed to improve the performance of OLED driving circuitry and also integrate the various electronic functions with an OLED display on a single piece of semiconductor material.

Referring first to FIG. 1, there is illustrated a single crystalline semiconductor substrate 10 which includes at least OLED driving circuitry 12 and logic and memory devices 14 fabricated thereon in accordance with a first process embodiment of the present disclosure. The single crystalline semiconductor substrate 10 may further include other functions including, for example, sensors, battery and/or solar cells formed thereon as well. In FIG. 1, element 15 denotes these other functions that can be formed on the single crystalline semiconductor substrate 10.

It is noted that although the drawings show the OLED driving circuitry 12, logic and memory devices 14, and other functions 15 to be located within the substrate 10, one skilled in the art would understand that the OLED driving circuitry 12, logic and memory devices 14 and other functions would be located upon and/or within the surface of the single crystalline semiconductor substrate 10. The drawings of the present disclosure merely provide a representation of the location in which such functions may be present on the single crystalline semiconductor substrate 10.

The term "single crystalline" as used in connection with the term single crystalline semiconductor substrate 10 denotes a semiconductor material in which the crystal lattice of the entire sample is continuous and unbroken to the edges of the sample, with no grain boundaries. The single crystalline semiconductor substrate 10 that can be employed in the present disclosure comprise a semiconductor material whose fracture toughness is less than that of the stressor material to be subsequently described. Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero, and mode III stress (tearing) is generally absent from the loading conditions. Fracture toughness is a quantitative way of expressing a material's resistance to brittle fracture when a crack is present.

The semiconductor material of the single crystalline semiconductor substrate 10 may include, but is not limited to, Si, Ge, SiGe, SiGeC, SiC, Ge alloys, GaSb, GaP, GaAs, InAs, InP, and all other III-V or II-VI compound semiconductors. Typically, the single crystalline semiconductor substrate 10 is comprised of silicon. In some embodiments, the single crystalline semiconductor substrate 10 is a bulk semiconductor material. In other embodiments, the single crystalline semiconductor substrate 10 may comprise a layered semiconductor material such as, for example, a semiconductor-on-insulator or a semiconductor on a polymeric substrate. Illustrated examples of semiconductor-on-insulator substrates that can be employed as single crystalline semiconductor substrate 10 include silicon-on-insulators and silicon-germanium-on-insulators.

The single crystalline semiconductor substrate 10 can be doped, undoped or contain doped regions and undoped regions.

The OLED driving circuitry 12, logic and memory devices 14, and other functions 15 such as, for example, sensors, batteries, and/or solar cell, can be formed utilizing techniques well known to those skilled in the art. The upper portion of the substrate 10 that includes the OLED driving circuitry 12, logic and memory devices 14, and other functions 15 can be removed from a remaining portion of the single crystalline semiconductor substrate 10 utilizing the method of the present disclosure.

The term "OLED driving circuitry" is used throughout the present disclosure to denote a network, i.e., an array, of thin film transistors (TFTs) that are formed utilizing conventional techniques such as deposition of the TFT elements and patterning those elements by lithography and etching. Specific details concerning the OLED driving circuitry are not provided herein so as not to obscure the process of the present disclosure.

The term "logic devices" is used throughout the present disclosure to denote an array of CMOS transistors which can be fabricated utilizing conventional techniques such as deposition of the transistor elements and patterning those elements by lithography and etching. Specific details concerning the logic devices are not provided herein so as not to obscure the process of the present disclosure.

The term "memory devices" is used throughout the present disclosure to denote an array of CMOS transistors and capacitors which can store information. The memory devices can be fabricated utilizing conventional techniques well known to those skilled in the art. Specific details concerning the memory devices are not provided herein so as not to obscure the process of the present disclosure.

It is noted that although this embodiment of the present disclosure describes and illustrates the OLED driving circuitry 12, logic and memory devices 14, and other functions 15 as be present on the single crystalline semiconductor substrate 10 at this point of the present disclosure, the present disclosure and method is not limited to only such an embodiment. Other embodiments are possible, as long as at least the logic and memory devices 14 are formed on the single crystalline semiconductor substrate 10 at this point of the present disclosure.

Figure 2:
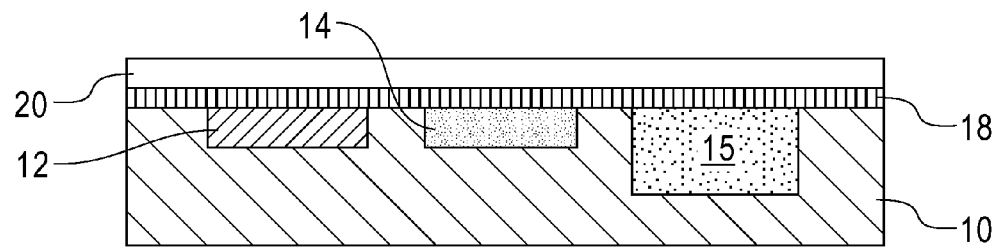
FIG. 2 is a pictorial representation (through a cross sectional view) illustrating the structure of FIG. 1 after forming a surface protection layer on an exposed surface of the single crystalline semiconductor substrate and after forming a stressor layer above the surface protection layer.

Referring to FIG. 2, there is illustrated the structure of FIG. 1 after forming a surface protection layer 18 on an exposed surface of the single crystalline semiconductor substrate 10 and after forming a stressor layer 20 above the surface protection layer 18.

The surface protection layer 18 that is employed in the present disclosure includes any material which can serve as an etch stop for the subsequently formed stressor layer 20. In one embodiment of the present disclosure, the surface protection layer 18 can include, but is not limited to, Ti/W, Ti, Cr, Ni or any combination thereof. Typically, and when Ni is used as the material of the stressor layer 20, the surface protection layer 18 comprises Ti. The surface protection layer 18 may comprise a single layer or it may include a multilayered structure comprising at least two layers of different.

The surface protection layer 18 can be formed at room temperature (15° C.-40° C., i.e., 288K to 313K) or above. In one embodiment, the surface protection layer 18 can be formed at a temperature which is from 20° C. (293K) to 180° C. (353K). In another embodiment, the surface protection layer 18 can be formed at a temperature which is from 20° C. (293K) to 60° C. (333K).

The surface protection layer 18 can be formed utilizing deposition techniques that are well known to those skilled in the art. For example, the surface protection layer 18 can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

In one embodiment, the surface protection layer 18 typically has a thickness from 5 nm to 200 nm, with a thickness from 100 nm to 150 nm being more typical. Other thicknesses for the surface protection layer 18 that are below and/or above the aforementioned thickness ranges can also be employed in the present disclosure.

In some embodiments, and prior to forming the stressor layer 20, an optional plating seed layer (not shown) can be formed on the surface protection layer 18. The optional plating seed layer is typically employed in embodiments in which the stressor material to be subsequently formed is a metal and plating is used to form the metal-containing stressor material. The optional plating seed layer is employed to selectively promote subsequent plating of a pre-selected metal-containing stressor material. The optional plating seed layer may comprise, for example, a single layer of Ni or a layered structure of two or more metals such as Al (bottom)/Ti/Ni (top).

The thickness of the optional plating seed layer may vary depending on the material or materials of the optional plating seed layer as well as the technique used in forming the same. Typically, the optional plating seed layer has a thickness from 2 nm to 400 nm. The optional plating seed layer can be formed by a conventional deposition process including, for example, chemical vapor deposition (CVD), plasma-enhanced chemical vapor deposition (PECVD), atomic layer deposition (ALD), and physical vapor deposition (PVD) techniques that may include evaporation and/or sputtering.

In accordance with the present disclosure, the surface protection layer 18 and, if employed, the optional plating seed layer, is (are) formed at a temperature which does not effectuate spontaneous spalling to occur within the single crystalline semiconductor substrate 10. By "spontaneous" it is meant that the removal of a thin material layer from the single crystalline semiconductor substrate 10 occurs without the need to employ any manual means to initiate crack formation and propagation for breaking apart the thin material layer from the single crystalline semiconductor substrate 10. By "manual" it is meant that crack formation and propagation are explicit for breaking apart the thin material layer from the single crystalline semiconductor substrate 10.

The stressor layer 20 that is employed in the present disclosure includes any material that is under tensile stress when located atop the single crystalline semiconductor substrate 10 at the spalling temperature. As such, the stressor material can also be referred to herein as a stress-inducing material. In accordance with the present disclosure, the stressor layer 20 has a critical thickness and stress value that cause spalling mode fracture to occur within the single crystalline semiconductor substrate 10. By "spalling mode fracture" it is meant that a crack is formed within the single crystalline semiconductor substrate 10 and the combination of loading forces maintain a crack trajectory at a depth below the stressor/substrate interface. By "critical condition", it is meant that for a given stressor material and single crystalline semiconductor substrate material combination, a thickness value and a stressor value for the stressor layer 20 is chosen that render spalling mode fracture possible (can produce a $K_I$ value greater than the $K_{IC}$ of the substrate).

The thickness of the stressor layer 20 is chosen to provide a desired fracture depth(s) within the single crystalline semiconductor substrate 10. For example, if the stressor layer 20 is chosen to be Ni, then fracture will occur at a depth below the stressor layer 20 roughly 2 to 3 times the Ni thickness. The stress value for the stressor layer 20 is chosen to satisfy the critical condition for spalling mode fracture. This can be estimated by inverting the empirical equation given by $t^* = [(2.5 \times 10^6)(K_{IC}^{3/2})]/\sigma^2$, where $t^*$ is the critical stressor layer thickness (in microns), $K_{IC}$ is the fracture toughness (in units of MPa·m$^{1/2}$) of the single crystalline semiconductor substrate 10 and $\sigma$ is the stress value of the stressor layer 20 (in MPa or megapascals). The above expression is a guide, in practice, spalling can occur at stress or thickness values up to 20% less than that predicted by the above expression.

Illustrative examples of materials that are under tensile stress when applied above the single crystalline semiconductor substrate 10 and thus can be used as the stressor layer 20 include, but are not limited to, a metal, a polymer, such as a spall inducing tape layer, or any combination thereof. The stressor layer 20 may comprise a single stressor material, or a multilayered stressor structure including at least two layers of different stressor material can be employed.

In one embodiment, the stressor layer 20 is a metal. In another embodiment, the stressor layer 20 is a spall inducing tape. In yet another embodiment, the stressor layer 20 may comprise a two-part stressor layer including a lower part and an upper part. The upper part of the two-part stressor layer can be comprised of a spall inducing tape layer.

When a metal is employed as stressor layer 20, the metal can include, for example, Ni, Cr, Fe, or W. Alloys of these metals can also be employed. In one embodiment, the stressor layer 20 includes at least one layer consisting of Ni.

When a polymer is employed as stressor layer 20, the polymer is a large macromolecule composed of repeating structural units. These subunits are typically connected by covalent chemical bonds. Illustrative examples of polymers that can be employed as the stressor layer include, but are not limited to, polyimides polyesters, polyolefins, polyacrylates, polyurethane, polyvinyl acetate, and polyvinyl chloride.

When a spall inducing tape layer is employed as stressor layer 20, the spall inducing tape layer includes any pressure sensitive tape that is flexible, soft, and stress free at a first temperature used to form the tape, yet strong, ductile and tensile at a second temperature used during spalling. By "pressure sensitive tape," it is meant an adhesive tape that will stick with application of pressure, without the need for solvent, heat, or water for activation. Tensile stress in the tape at the second temperature is primarily due to thermal expansion mismatch between the single crystalline semiconductor substrate 10 (with a lower thermal coefficient of expansion) and the tape (with a higher thermal expansion coefficient).

Typically, the pressure sensitive tape that is employed in the present disclosure as stressor layer 20 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

The stressor layer 20 can be formed utilizing any well known deposition process. Generally, deposition may be accomplished by any of dip coating, spin-coating, brush coating, sputtering, chemical vapor deposition, plasma enhanced chemical vapor deposition, chemical solution deposition, physical vapor deposition, and plating to form the stressor layer 20 that includes a metal or polymer as the stressor material. In some embodiments, and when the stressor layer 20 is a tape, the stressor layer 20 can be applied by hand or by mechanical means.

The stressor layer 20 can be formed at a first temperature which is at room temperature (15° C.-40° C.). In another embodiment, when a tape layer is employed, the tape layer can be formed at a first temperature which is from 15° C. to 60° C.

If the stressor layer 20 is of a metallic nature, it typically has a thickness within a range from 3 µm to 50 µm, with a thickness within a range from 4 µm to 7 µm being more typical. Other thicknesses for the stressor layer 20 that are below and/or above the aforementioned thickness ranges can also be employed in the present disclosure.

If the stressor layer 20 is of a polymeric nature, it typically has a thickness in a range from 10 µm to 200 µm, with a thickness within a range from 50 µm to 100 µm being more typical. Other thicknesses for the stressor layer 20 that are below and/or above the aforementioned thickness ranges can also be employed in the present disclosure.

Figure 3:
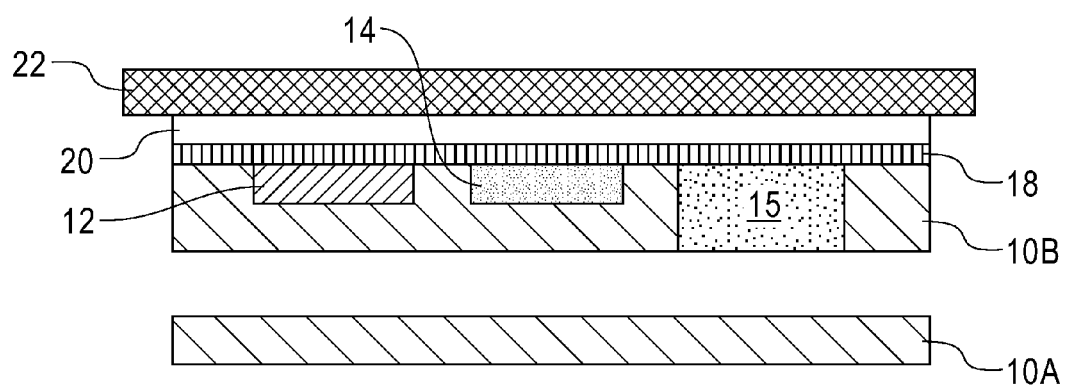
FIG. 3 is a pictorial representation (through a cross sectional view) illustrating the structure of FIG. 2 after forming a handle substrate above the stressor layer and after spalling.

Referring to FIG. 3, there is illustrated the structure of FIG. 2 after forming a handle substrate 22 above the stressor layer 20 and after spalling. In some embodiments of the present disclosure, the handle substrate 22 can be omitted. Thus, handle substrate 22 is an optional component of the present disclosure. The handle substrate 22 employed in the present disclosure comprises any flexible material which has a minimum radius of curvature that is typically less than 30 cm. Illustrative examples of flexible materials that can be employed as the handle substrate 22 include a metal foil or a polyimide foil.

The handle substrate 22 can be used to provide better fracture control and more versatility in handling the spalled portion, i.e., the portion of the single crystalline semiconductor substrate 10 below the stressor layer 20 and above the fracture surfaces of the single crystalline semiconductor substrate 10. Moreover, the handle substrate 22 can be used to guide the crack propagation during spalling. The handle substrate 22 of the present disclosure is typically, but not necessarily, formed at a first temperature which is at room temperature (15° C.-40° C.).

The handle substrate 22 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating. In some embodiments, the handle substrate 22 can be applied atop the stressor layer 20 by hand or by mechanical means.

The handle substrate 22 typical has a thickness of from 1 µm to few mm, with a thickness of from 70 µm to 120 µm being more typical. Other thicknesses for the handle substrate 22 that are below and/or above the aforementioned thickness ranges can also be employed in the present disclosure.

Spalling can be initiated at room temperature or at a temperature that is less than room temperature. In one embodiment, spalling is performed at room temperature (i.e., 20° C. to 40° C.). In another embodiment, spalling is performed at a temperature less than 20° C. In a further embodiment, spalling occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, the less than room temperature spalling process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas.

When spalling is performed at a temperature that is below room temperature, the spalled structure is returned to room temperature by allowing the spalled structure to slowly warm up to room temperature by allowing the same to stand at room temperature. Alternatively, the spalled structure can be heated up to room temperature utilizing any heating means.

As shown in FIG. 3, spalling removes a portion of the single crystalline semiconductor substrate 10 not containing the OLED driving circuitry 12, logic and memory devices 14, and other functions 15 from another portion of the single crystalline semiconductor substrate 10 which contains the OLED driving circuitry 12, logic and memory devices 14, and other functions 15. In the drawing, element 10A refers to the portion of the single crystalline semiconductor substrate 10 not containing OLED driving circuitry 12, logic and memory devices 14, and other functions 15, while element 10B refers to the portion of the single crystalline semiconductor substrate which contains OLED driving circuitry 12, logic and memory devices 14, and other functions 15.

Element 10B can also be referred to herein as a spalled single crystalline semiconductor layer (or spalled layer for short), while element 10A can be referred to herein as a non-spalled layer. As shown, the spalled layer 10B which contains a portion of the single crystalline semiconductor substrate which contains OLED driving circuitry 12, logic and memory devices 14, and other functions 15 still contains the surface protection layer 18, stressor layer 20 and handle substrate 22.

In one embodiment of the present disclosure, the spalled layer 10B has a thickness of less than 100 microns. In another embodiment of the present disclosure, the spalled layer 10B has a thickness of less than 50 microns. In yet another embodiment of the present disclosure, spalled layer 10B has a thickness from 25 microns to 40 microns.

Figure 4:
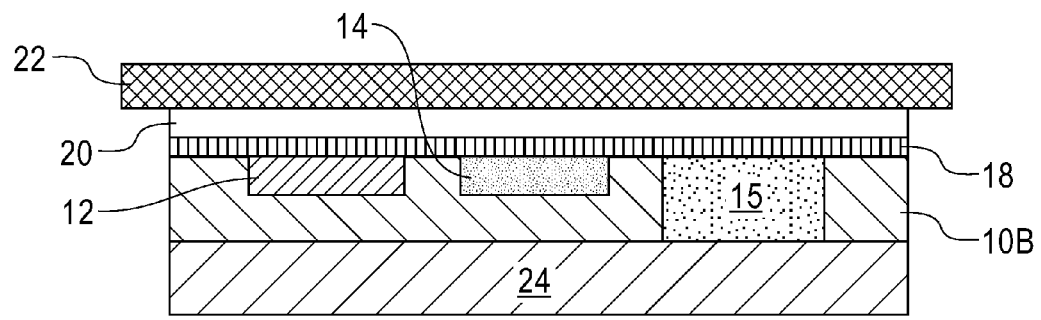
FIG. 4 is a pictorial representation (through a cross sectional view) illustrating the structure of FIG. 3 after forming a substrate on a bottommost surface of a spalled single crystalline semiconductor layer.

Referring now to FIG. 4, there is illustrated the structure of FIG. 3 after forming a substrate 24 on a bottommost surface of the spalled layer 10B which is opposite the surface including OLED driving circuitry 12, logic and memory devices 14, and other functions 15. The substrate 24 may be rigid or flexible and may include, for example, a semiconductor material, glass, a ceramic, tape, or a plastic. Typically, substrate 24 is comprised of glass or a plastic. The substrate 24 can be formed on the bottommost surface of spalled layer 10B by bonding. Bonding can be achieved at room temperature, up to about 300° C.

The application of substrate 24 to the spalled layer 10B may occur in the present of, or the absence of, the surface protection layer 18, stressor layer 20 and handle substrate 22. In the embodiment illustrated in FIG. 4, the substrate 24 is formed onto the spalled layer 10B in the presence of the surface protection layer 18, stressor layer 20 and handle substrate 22.

Figure 5:
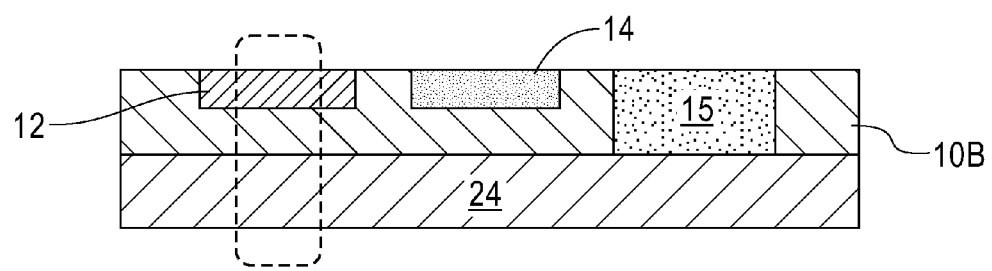
FIG. 5 is a pictorial representation (through a cross sectional view) illustrating the structure of FIG. 4 after removing the handle substrate, stressor layer and surface protection layer from the spalled single crystalline semiconductor layer.

Referring to FIG. 5, there is illustrated the structure of FIG. 4 after removing the handle substrate 22, stressor layer 20 and surface protection layer 18 from the spalled layer 10B. The handle substrate 22, stressor layer 20, and, surface protection layer 18 can be removed from the spalled 10B utilizing conventional techniques well known to those skilled in the art.

For example, and in one embodiment, aqua regia ($HNO_3$/HCl) can be used for removing the handle substrate 22, the stressor layer 20, the optional plating seed layer and the surface protection layer 18. In another example, UV or heat treatment can be used to remove the handle substrate 22, followed by a chemical etch to remove the stressor layer 20, followed by a different chemical etch to remove the optional plating seed layer and the surface protection layer 18.

Figure 6:
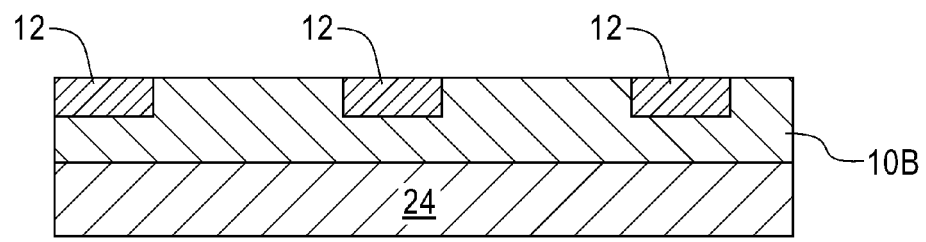
FIG. 6 is a pictorial representation of the structure illustrated in FIG. 5 depicting the OLED driving circuitry in the circle area along a plane which runs into and out of the paper.

Referring now FIG. 6, there is illustrated the structure of FIG. 5 depicting the OLED driving circuitry in the circle area along a plane which runs into and out of the paper. Specifically, FIG. 6 shows a structure including substrate 24, spalled layer 10B, and an array of OLED driving circuitry 12, i.e., TFTs, present in and upon the spalled layer 10B.

Figure 7A:
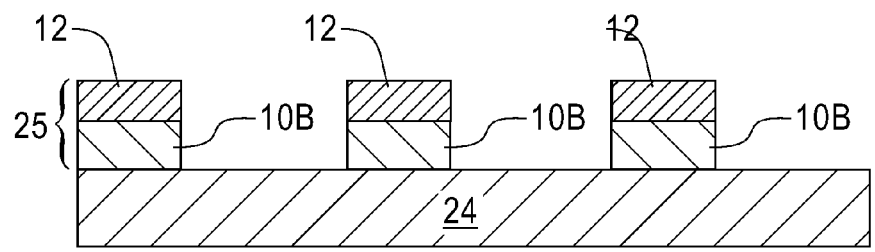
FIG. 7A is a pictorial representation of the structure illustrated in FIG. 6 after etching exposed portions of the spalled single crystalline semiconductor layer which are located between adjacent OLED driving circuitry in accordance with an embodiment of the present disclosure in which an OLED display having bottom emission is provided.

Referring now to FIG. 7A, there is illustrated the structure of FIG. 6 after etching exposed portions of the spalled layer 10B which are located between adjacent thin film transistors in accordance with an embodiment of the present disclosure in which an OLED display having bottom emission is provided. The etching of the exposed portions of the spalled single crystalline semiconductor layer 10B, which stops atop an uppermost surface of substrate 24, is performed utilizing a selective etching process that removes semiconductor material selective to the OLED driving circuitry. The etching provides a material stack 25 comprising, from top to bottom, OLED driving circuitry 12 and a remaining portion of the spalled single crystalline semiconductor layer 10B.

In one embodiment of the present disclosure, the selective etching process may include deposition of an etch mask (usually an oxide layer) and silicon etching with a wet chemical etch such as, for example, tetramethylammonium hydroxide (TMAH), or KOH etching, or a dry etch including, for example, fluorine based chemistry. A block mask (not shown) may be formed upon other portions of the spalled layer 10B so as to protect the regions including the logic and memory devices 14 and other functions 15.

Figure 7B:
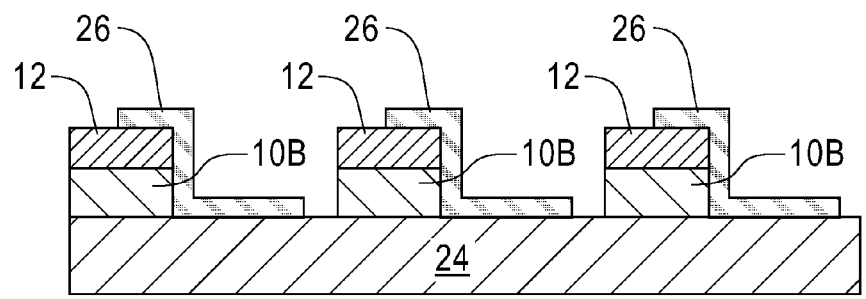
FIG. 7B is a pictorial representation of the structure illustrated in FIG. 7A after formation of a bottom transparent electrode.

Referring now to FIG. 7B, there is illustrated the structure of FIG. 7A after formation of a bottom transparent electrode 26. The bottom transparent electrode 26 is formed upon the uppermost surface of material stack 25, and on the exposed uppermost surface of the substrate 24 which is located between adjacent materials stacks 25. The bottom transparent electrode can include a transparent conductive oxide such as, but not limited to, a fluorine-doped tin oxide ($SnO_2$:F), an aluminum-doped zinc oxide (ZnO:Al), tin oxide (SnO) and indium tin oxide ($InSnO_2$, or ITO for short). Multilayered stacks of such transparent conductive oxides can also be employed as the bottom electrode 26.

The thickness of the bottom transparent electrode 26 may vary depending on the type of transparent conductive material employed, as well as the technique that was used in forming the transparent conductive material. Typically, and in one embodiment, the thickness of the bottom transparent electrode 26 ranges from 20 nm to 500 nm. Other thicknesses, including those less than 20 nm and/or greater than 500 nm can also be employed. The optimum thickness of bottom transparent electrode 26 for minimizing reflection from the surface of Si is in the range of 70 nm to 110 nm.

The bottom transparent electrode 26 is typically formed using a deposition process, such as sputtering or CVD. Examples of CVD processes suitable for forming the bottom transparent electrode material include, but are not limited to, APCVD, LPCVD, PECVD; MOCVD and combinations thereof. Examples of sputtering are included but not limited to RF and DC magnetron sputtering. In some embodiments, a patterning process may follow the deposition of the bottom transparent electrode material.

Figure 7C:
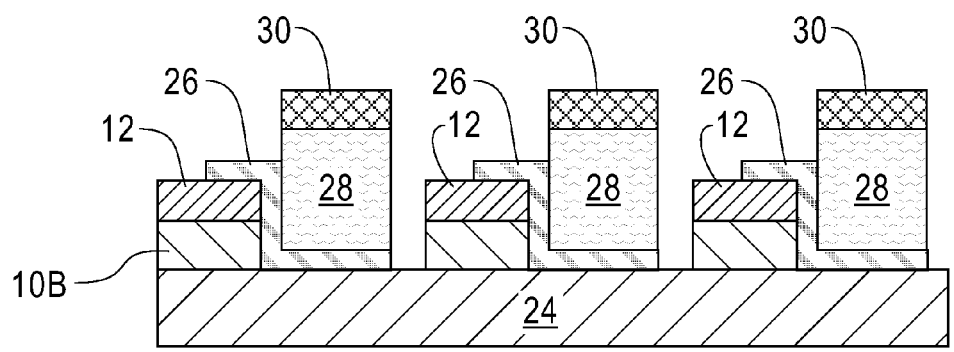
FIG. 7C is a pictorial representation of the structure illustrated in FIG. 7B after formation of an organic electroluminescent material and a top electrode.

Referring now to FIG. 7C, there is illustrated the structure of FIG. 7B after formation of an organic electroluminescent material 28 and a top electrode 30. As shown, the organic electroluminescent material 28 and the top electrode 30 are positioned above a portion of the bottom transparent electrode 26 which is located on the exposed surface of substrate 24.

The organic electroluminescent material 28 that is employed in the present disclosure includes any organic material or multilayered stack of organic materials including, for example, organometallic chelates, conductive polymers, fluorescent dyes, phosphorescent dyes and conjugated dendrimers, that emits light in response to an electric current. Examples of organic materials that can be used as the organic electroluminescent material 28 include, but are not limited to, poly(p-phenylenvinylene) (PPV), poly(naphthalene vinylenes) (PNVs), tris(2-phenyl pyridine)iridium ($Ir(ppy)_3$), and tris(8-oxychinolinato)aluminum ($Alq_3$).

The organic electroluminescent material 28 can be formed by conventional techniques including, for example, spin-on coating, dip coating, immersion, and chemical vapor deposition. Typically, and in one embodiment, the thickness of the organic electroluminescent material 28 ranges from a few nm to a few hundred nm. Other thicknesses, including those above and/or below the aforementioned range can also be employed.

In some embodiments, the top electrode 30 can include a material or a multilayered stack of materials having a lower work function than bottom transparent electrode 26. For example, the top electrode 30 can be comprised of aluminum (Al), calcium (Ca) and/or magnesium (Mg). In another embodiment, the top electrode 30 may include one of the transparent conductive oxides mentioned above. The top electrode 30 can be formed utilizing any deposition process including for example, thermal evaporation and sputtering through a shadow mask. Typically, and in one embodiment, the thickness of the top electrode 30 ranges from 20 nm to 100 nm. Other thicknesses, including those above and/or below the aforementioned range can also be employed.

In the bottom emission OLED display devices of this embodiment of the present disclosure, the organic electroluminescent material 28 and the top electrode 30 can have sidewall surfaces that are vertically coincident to each other.

Figure 8:
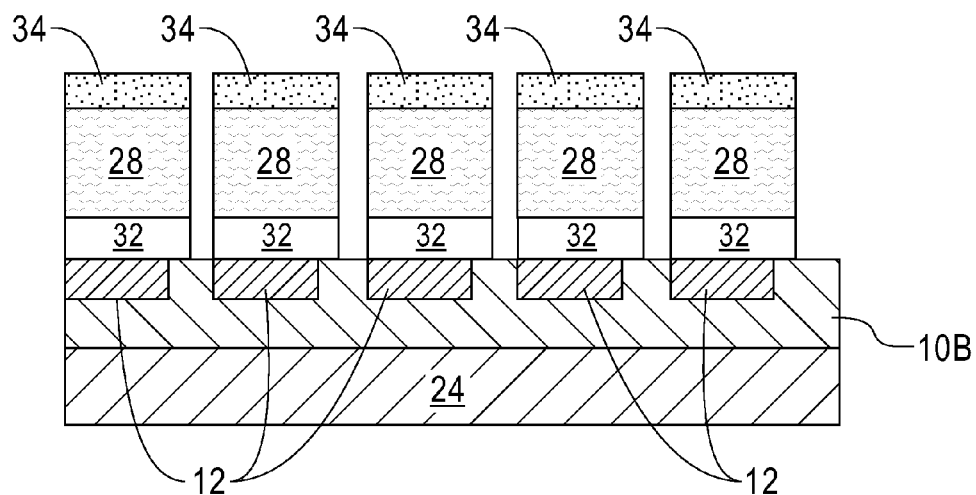
FIG. 8 is a pictorial representation of the structure illustrated in FIG. 6 after depositing a bottom electrode, an organic electroluminescent material and a top transparent electrode in accordance with an embodiment of the present disclosure in which an OLED display having top emission is provided.

Reference is now made to FIG. 8, which is a representation of the structure illustrated in FIG. 6 after depositing a bottom electrode 32, an organic electroluminescent material 28 and a top transparent electrode 34 in accordance with an embodiment of the present disclosure in which an OLED display having top emission is provided. In this embodiment of the present disclosure, bottom electrode 32 includes one the materials mentioned above for top electrode 30, while the top transparent electrode 34 includes one of the materials mentioned above for bottom transparent electrode 26. The bottom electrode 32, organic electroluminescent material 28 and top transparent electrode 34 can be formed as mentioned above in the bottom emission embodiment of the present disclosure.

In the top emission OLED display devices of this embodiment of the present disclosure, the bottom electrode 32, the organic electroluminescent material 28 and the top transparent electrode 24 can have sidewall surfaces that are vertically coincident to each other.

Figure 9:
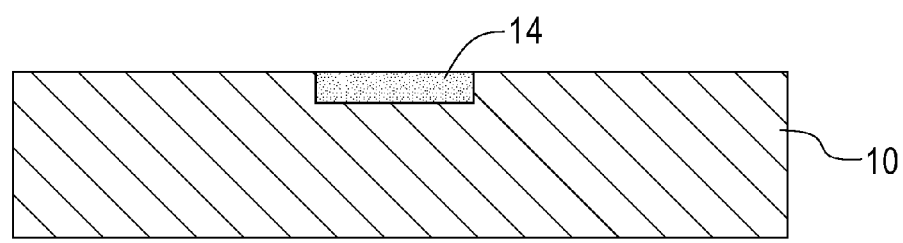
FIG. 9 is a pictorial representation (through a cross sectional view) illustrating a single crystalline semiconductor substrate which includes logic and memory devices fabricated thereon in accordance with a second process embodiment of the present disclosure.

Referring now to FIG. 9, there is illustrated a single crystalline semiconductor substrate 10 which includes CMOS logic and memory devices 14 fabricated thereon in accordance with a second process embodiment of the present disclosure. Particularly, this embodiment utilizes a structure similar to the one illustrated in FIG. 1 except that the OLED driving circuitry 12 and the other functions are not yet formed into the single crystalline semiconductor substrate 10.

Figure 10:
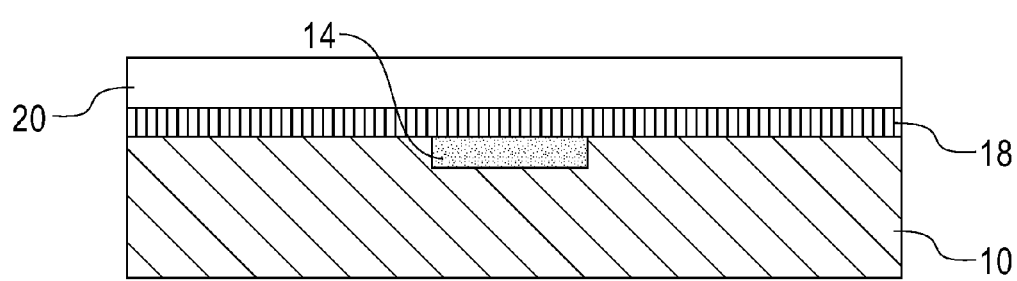
FIG. 10 is a pictorial representation (through a cross sectional view) illustrating the structure of FIG. 9 after forming a surface protection layer on an exposed surface of the single crystalline semiconductor substrate and after forming a stressor layer above the surface protection layer.

Referring now to FIG. 10, there is illustrated the structure of FIG. 9 after forming a surface protection layer 18 on an exposed surface of the single crystalline semiconductor substrate 10 and after forming a stressor layer 20 above the surface protection layer 18. The surface protection layer 18 and the stressor layer 20 are the same as those described above in forming the structure shown in FIG. 2.

Figure 11:
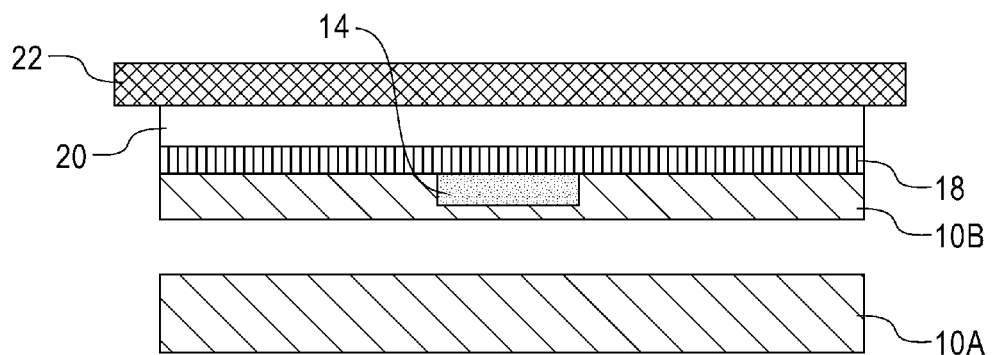
FIG. 11 is a pictorial representation (through a cross sectional view) illustrating the structure of FIG. 10 after forming a handle substrate above the stressor layer and after spalling.

Referring now to FIG. 11, there is illustrated the structure of FIG. 10 after forming a handle substrate 22 above the stressor layer 20 and after spalling. In some embodiments, the handle substrate 22 can be omitted. The handle substrate 22 and means for forming the same are as described above in forming the structure shown in FIG. 3. The spalling process used in this embodiment of the present disclosure is the same as the spalling process mentioned in the previous embodiment of the present disclosure. In this embodiment, the spalled layer 10B includes only the CMOS logic and memory devices 14 located thereon.

Figure 12:
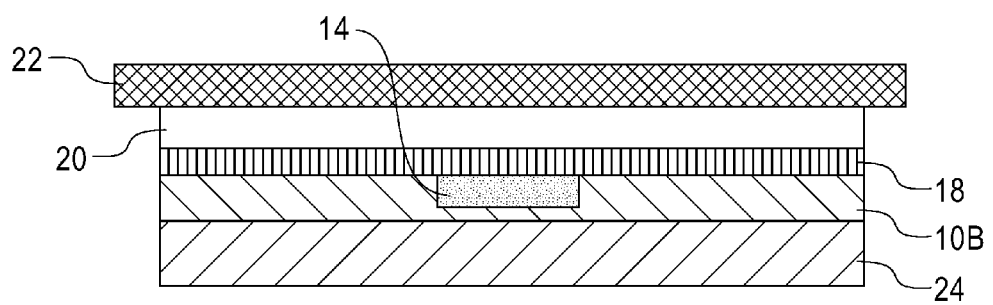
FIG. 12 is a pictorial representation (through a cross sectional view) illustrating the structure of FIG. 11 after forming a substrate on a bottommost surface of the spalled single crystalline semiconductor layer.

Referring now to FIG. 12, there is illustrated the structure of FIG. 11 after forming substrate 24 on a bottommost surface of the spalled layer 10B. Substrate 24 used in this embodiment includes one of the substrates mentioned above in forming the structure shown in FIG. 4. Also, the bonding technique mentioned above can be used here for forming the structure shown in FIG. 12.

Figure 13:
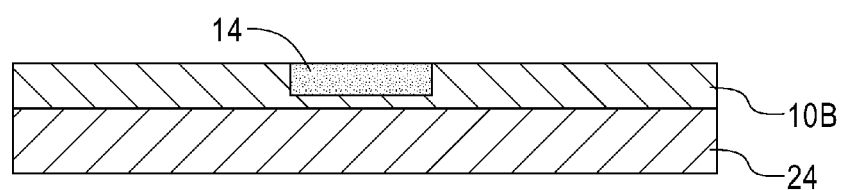
FIG. 13 is a pictorial representation (through a cross sectional view) illustrating the structure of FIG. 12 after removing the handle substrate, stressor layer and surface protection layer from the spalled single crystalline semiconductor layer.

Referring now to FIG. 13, there is illustrated the structure of FIG. 12 after removing the handle substrate 22, stressor layer 20 and surface protection layer 18 from the spalled layer 10B. The removal of the handle substrate 22, stressor layer 20 and surface protection layer 18 includes one of the techniques mentioned above in forming the structure shown in FIG. 5. In some embodiments, the handle substrate 22, stressor layer 20 and surface protection layer 18 can be removed prior to forming the substrate 24 on the bottommost surface of the spalled single crystalline semiconductor layer 10B.

Figure 14:
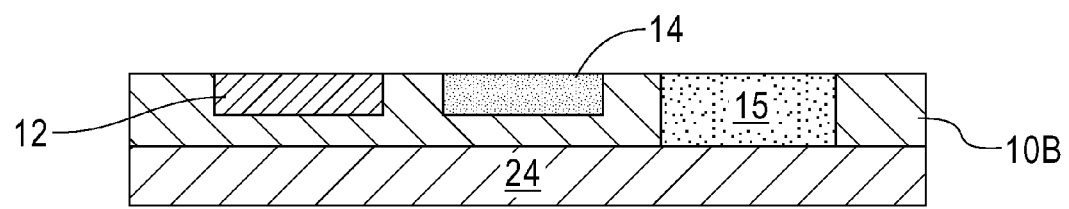
FIG. 14 is a pictorial representation (through a cross sectional view) illustrating the structure of FIG. 13 after formation of optional other functions and after formation of OLED driving circuitry.

Referring now to FIG. 14, there is illustrated the structure of FIG. 13 after formation of optional other functions 15 and after formation of OLED driving circuitry 12. The optional other functions 15 and OLED device circuitry 12 are the same as that described above in connection with FIG. 1 of the present disclosure.

After providing the structure shown in FIG. 14, the processing used in FIG. 7A-7C can be used in providing an OLED display having bottom emission, or the processing used in FIG. 8 can be used in forming OLED display having top emission.

Figure 15:
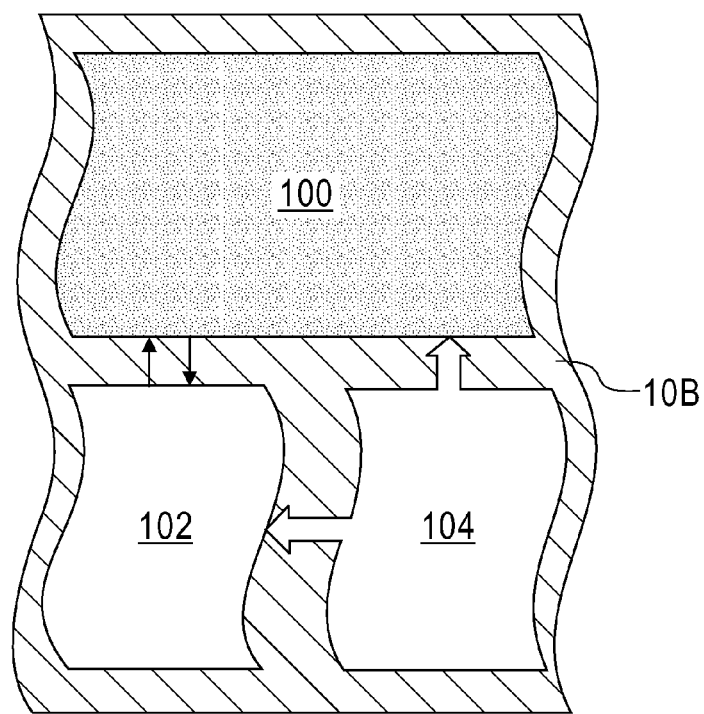
FIG. 15 is a pictorial representation (though a top-down view) illustrating a semiconductor structure in accordance with the present disclosure which includes an OLED display with OLED driving circuitry, CMOS logic and memory devices, as well as other functions integrated on a same single crystalline semiconductor layer.

Notwithstanding which of the above embodiments are used or whether an OLED display having a bottom emission or a top emission is provided, the method of the present disclosure provides a semiconductor structure such as shown, for example, in FIG. 15, which includes an OLED display 100, CMOS logic and memory devices 102, as well as other functions 104 integrated on a same single crystalline semiconductor layer, i.e. spalled layer 10B. OLED driving circuitry is positioned beneath the OLED display 100. The OLED display may include a plurality of top emission OLED devices or a plurality of bottom emission OLED devices.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method for forming a structure including an OLED display with semiconductor driving circuitry and other functions, said method comprising:

providing a single crystalline semiconductor substrate having at least logic and memory devices formed on an exposed surface of the single crystalline semiconductor substrate;

forming a surface protection layer on the exposed surface of the single crystalline semiconductor substrate having the at least logic and memory devices formed thereon;

forming a stressor layer above the surface protection layer, wherein said stressor layer has a thickness and a tensile stress value that causes spalling mode fracture to occur within the single crystalline semiconductor substrate upon spalling;

spalling the single crystalline semiconductor substrate to provide a spalled single crystalline semiconductor layer having the at least logic and memory devices located on a surface thereof, wherein said spalling is performed spontaneously without using any manual means to initiate crack formation and propagation;

forming a substrate on a surface of the spalled single crystalline semiconductor layer opposite the surface having the at least logic and memory devices located thereon; and forming an organic light emitting diode (OLED) display on the spalled single crystalline semiconductor layer and adjacent the at least logic and memory devices.

2. The method of claim 1, wherein said single crystalline semiconductor substrate further comprises OLED driving circuitry located on the exposed surface of the single crystalline semiconductor substrate and adjacent the at least logic and memory devices, wherein said OLED driving circuitry is formed prior to forming the surface protection layer.

3. The method of claim 1 further comprising forming OLED driving circuitry on a portion of the spalled single crystalline semiconductor layer prior to said forming said OLED display.

4. The method of claim 1, wherein forming the surface protection layer includes selecting one of Ti/W, Ti, Cr, or Ni as a surface protection material, and depositing said surface protection material.

5. The method of claim 1, wherein said single crystalline semiconductor substrate has a fracture toughness that is lower than a fracture toughness of said stressor layer.

6. The method of claim 5, wherein said stressor layer comprises a metal, a polymer or any combination thereof.

7. The method of claim 6, wherein said stressor layer includes at least said polymer, and said polymer is a spall inducing tape layer.

8. The method of claim 6, wherein said stressor layer comprises said metal, and said metal is nickel.

9. The method of claim 1, wherein said spalling is performed at room temperature.

10. The method of claim 1, wherein said spalling is performed a temperature less than room temperature.

11. The method of claim 1 further comprising forming a handle substrate atop said stressor layer prior to spalling, wherein said handle substrate extends beyond the maximum length of the single crystalline substrate and has a radius of curvature.

12. The method of claim 1 further comprising removing an entirety of the stressor layer after forming said substrate.

13. The method of claim 1 further comprising removing an entirety of the stressor layer prior to forming said substrate.

14. The method of claim 1, wherein said substrate is glass or plastic and is formed onto said surface of the spalled single crystalline semiconductor layer opposite the surface having the at least logic and memory devices located thereon by bonding.

15. The method of claim 1, wherein said OLED display is formed on OLED driving circuitry.

16. The method of claim 15, wherein said forming said OLED display comprises forming an array of bottom emission OLED devices, wherein each bottom emission OLED device of the array of bottom emission OLED devices includes a bottom transparent electrode, an organic electroluminescent material and a top electrode.

17. The method of claim 15, wherein said forming said array of bottom emission devices comprises etching exposed portions of the spalled single crystalline semiconductor layer located between adjacent OLED driving circuitry, and forming said bottom transparent electrode, wherein a portion of said bottom transparent electrode is in direct contact with an uppermost surface of a substrate that underlies said spalled single crystalline semiconductor layer.

18. The method of claim 15, wherein said forming said OLED display comprises forming an array of top emission OLED devices, wherein each top emission OLED device of the array of top emission OLED devices includes a bottom electrode, an organic electroluminescent material and a top transparent electrode.

* * * * *